(12) United States Patent
Chidambarrao et al.

(10) Patent No.: US 7,675,118 B2
(45) Date of Patent: Mar. 9, 2010

(54) SEMICONDUCTOR STRUCTURE WITH ENHANCED PERFORMANCE USING A SIMPLIFIED DUAL STRESS LINER CONFIGURATION

(75) Inventors: Dureseti Chidambarrao, Weston, CT (US); Yaocheng Liu, Elmsford, NY (US); William K. Henson, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 164 days.

(21) Appl. No.: 11/468,958

(22) Filed: Aug. 31, 2006

(65) Prior Publication Data

US 2008/0054357 A1  Mar. 6, 2008

(51) Int. Cl.
*H01L 27/12* (2006.01)
(52) U.S. Cl. .................. 257/369; 257/347; 257/351; 257/632; 257/635; 257/638; 257/639; 257/640; 257/E21.632; 438/153; 438/154; 438/199; 438/791
(58) Field of Classification Search .............. 257/351, 257/347, 369, 632, 635, 638, 639, 640, E21.632; 438/153, 154, 199, 791
See application file for complete search history.

(56) References Cited

U.S. PATENT DOCUMENTS

| | | | |
|---|---|---|---|
| 7,187,038 B2 * | 3/2007 | Morin et al. ................ | 257/369 |
| 7,314,836 B2 * | 1/2008 | Golonzka et al. ........... | 438/761 |
| 7,439,120 B2 * | 10/2008 | Pei .............................. | 438/197 |
| 2003/0040158 A1 * | 2/2003 | Saitoh ........................ | 438/279 |
| 2004/0251479 A1 * | 12/2004 | Tsutsui et al. ............... | 257/249 |
| 2005/0074932 A1 * | 4/2005 | Lin et al. ..................... | 438/199 |
| 2005/0230756 A1 * | 10/2005 | Chang et al. ................ | 257/351 |
| 2006/0006420 A1 * | 1/2006 | Goto ........................... | 257/204 |
| 2006/0094193 A1 * | 5/2006 | Horstmann et al. ......... | 438/299 |
| 2006/0160290 A1 * | 7/2006 | Chong et al. ................ | 438/199 |

(Continued)

OTHER PUBLICATIONS

C.T. Lin et al., "Novel FUSI Strained Engineering for 45-nm Node CMOS Performance Enhancement", 2006 Symposium on VLSI Technology Digest of Technical Papers, 2006 IEEE, 2 pages.

*Primary Examiner*—Kiesha R. Bryant
*Assistant Examiner*—Eric Ward
(74) *Attorney, Agent, or Firm*—Scully, Scott, Murphy & Presser, P.C.; H. Daniel Schnurmann

(57) ABSTRACT

A semiconductor structure including an nFET having a fully silicided gate electrode wherein a new dual stress liner configuration is used to enhance the stress in the channel region that lies beneath the gate electrode is provided. The new dual stress liner configuration includes a first stress liner that has an upper surface that is substantially planar with an upper surface of a fully silicided gate electrode of the nFET. In accordance with the present invention, the first stress liner is not present atop the nFET including the fully silicided gate electrode. Instead, the first stress liner of the present invention partially wraps around, i.e., surrounds the sides of, the nFET with the fully silicided gate electrode. A second stress liner having an opposite polarity as that of the first stress liner (i.e., of an opposite stress type) is located on the upper surface of the first stress liner as well as atop the nFET that contains the fully silicided FET. In accordance with the present invention, the first stress liner is a tensile stress liner and the second stress liner is a compressive stress liner.

22 Claims, 4 Drawing Sheets

U.S. PATENT DOCUMENTS

2006/0284255 A1* 12/2006 Shin et al. .................. 257/351
2008/0185659 A1* 8/2008 Ke et al. .................... 257/371
2008/0214008 A1* 9/2008 Moritoki et al. ............. 438/694

* cited by examiner

SEMICONDUCTOR STRUCTURE WITH ENHANCED PERFORMANCE USING A SIMPLIFIED DUAL STRESS LINER CONFIGURATION

FIELD OF THE INVENTION

The present invention relates to a semiconductor structure and a method of fabricating the same. More particularly, the present invention relates to a complementary metal oxide semiconductor (CMOS) structure including an n-type field effect transistor (nFET) having a fully silicided gate electrode in which an improved dual stress liner configuration is employed to incorporate mechanical stress into the device channel of the nFET.

BACKGROUND OF THE INVENTION

For more than three decades, the continued miniaturization of silicon metal oxide semiconductor field effect transistors (MOSFETs) has driven the worldwide semiconductor industry. Various showstoppers to continue scaling have been predicated for decades, but a history of innovation has sustained Moore's Law in spite of many challenges. However, there are growing signs today that metal oxide semiconductor transistors are beginning to reach their traditional scaling limits.

Since it has become increasingly difficult to improve MOSFETs and therefore CMOS performance through continued scaling, methods for improving performance without scaling have become critical. One approach for doing this is to increase carrier (electron and/or hole) mobilities. Increased carrier mobility can be obtained, for example, by introducing the appropriate stress/strain into the semiconductor lattice.

The application of stress changes the lattice dimensions of the semiconductor substrate. By changing the lattice dimensions, the electronic band structure of the material is changed as well. The change may only be slight in intrinsic semiconductors resulting in only a small change in resistance, but when the semiconducting material is doped, i.e., n-type, and partially ionized, a very small change in the energy bands can cause a large percentage change in the energy difference between the impurity levels and the band edge. This results in changes in carrier transport properties, which can be dramatic in certain cases. The application of physical stress (tensile or compressive) can be further used to enhance the performance of devices fabricated on the semiconductor substrates.

Compressive strain along the device channel increases drive current in p-type field effect transistors (pFETs) and decreases drive current in n-type field effect transistors (nFETs). Tensile strain along the device channel increases drive current in nFETs and decreases drive current in pFETs.

Stress can be introduced into a single crystal oriented substrate by several methods including, for example, forming a stress liner on top of the substrate and around the gate region. Depending on the conductivity type of the FET (i.e., p or n), the stress liner can be under tensile stress (preferred for nFETs) or compressive stress (preferred for pFETs).

When nFETs and pFETs are integrated onto the same semiconductor substrate, dual stress liner technology is typically used in which a first stress liner under tensile stress is formed around each nFET, while a second stress liner under compressive stress is formed around each pFET.

In the case where a fully silicided gate electrode is employed, particularly for nFETs, a single stress liner is itself weak and a dual stress liner makes the stresses smaller. Hence, a new and improved dual stress liner configuration is needed for CMOS structures, particularly those including nFETs having fully silicided gate electrodes.

SUMMARY OF THE INVENTION

The present invention provides a semiconductor structure including an nFET having a fully silicided gate electrode wherein a new dual stress liner configuration is used to enhance the stress in the channel region that lies beneath the gate electrode of the nFET. The new dual stress liner configuration includes a first stress liner that has an upper surface that is substantially planar with an upper surface of the fully silicided gate electrode of the nFET. In accordance with the present invention, the first stress liner is not present atop the nFET. Instead, the first stress liner of the present invention partially wraps around, i.e., partially surrounds the sides of, the nFET with the fully silicided gate electrode. A second stress liner of an opposite stress type as that of the first stress liner is located on the upper surface of the first stress liner as well as atop the nFET that contains the fully silicided gate electrode.

In general terms, the semiconductor structure of the present invention comprises:

at least one n-type field effect transistor (nFET) located on a surface of a semiconductor structure, said at least one nFET including a material stack comprising a fully silicided gate electrode overlying a gate dielectric, and at least one spacer located on vertical sidewalls of said material stack;

a first stress liner located on said semiconductor substrate and partially wrapping around said at least one nFET, said first stress liner having an upper surface that is substantially planar with an upper surface of said fully silicided gate electrode of said nFET; and a second stress liner of an opposite stress type as that of the first stress liner located on said upper surface of said first stress liner and atop the at least one nFET.

In accordance with the present invention, the first stress liner is a tensile stress liner and the second stress liner is a compressive stress liner. In a highly preferred embodiment of the present invention, the first and second stress liners are both comprised of nitrides. In yet another embodiment of the present invention, at least one pFET is also present on the surface of the semiconductor substrate. In such an embodiment, the first stress liner is also a tensile stress liner and the second stress liner is also a compressive stress liner. In the embodiment including at least one nFET and at least one pFET, the tensile stress liner is not present on the pFET.

When both at least one nFET and at least one pFET are present, the semiconductor structure includes:

at least one n-type field effect transistor and at least one p-type field effect transistor located on a surface of a semiconductor structure, said at least one n-type field effect transistor including a material stack formed by a fully silicided gate electrode overlying a gate dielectric, and at least one spacer located on vertical sidewalls of said material stack;

a tensile stress liner located on a portion of said semiconductor substrate including said at least one n-type field effect transistor, said tensile stress liner partially wraps around said at least one n-type field effect transistor and has an upper surface that is substantially planar with an upper surface of said fully silicided gate electrode; and a compressive stress liner located on said upper surface of said first stress liner and atop the at least one n-type field effect transistor, said compressive liner completely surrounds said at least one p-type field effect transistor.

In addition to providing a semiconductor structure including a new dual stress liner configuration, the present invention also provides a method of fabricating the same. In general terms, the method of the present invention includes:

providing at least one n-type field effect transistor (nFET) on a surface of a semiconductor structure, said at least one nFET including a material stack forming a fully silicided gate electrode overlying a gate dielectric, and at least one spacer located on vertical sidewalls of said material stack;

forming a first stress liner on said semiconductor substrate, wherein said first stress liner partially wraps around said at least one nFET and has an upper surface that is substantially planar with an upper surface of said fully silicided gate electrode; and forming a second stress liner of an opposite type as that of the first stress liner on said upper surface of said first stress liner and atop the at least one nFET.

DETAILED DESCRIPTION OF THE INVENTION

The present invention, which provides a semiconductor structure including an nFET having a fully silicided gate electrode wherein a new dual stress liner configuration is used to enhance the stress in the channel region that lies beneath the gate electrode as well as a method of fabricating such a structure, will now be described in greater detail by referring to the following discussion and drawings that accompany the present application. It is noted that the drawings of the present application are provided for illustrative purposes and, as such, the drawings are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

As stated above, the present invention provides a semiconductor structure including an nFET having a fully silicided gate electrode wherein a new dual stress liner configuration is used to enhance the stress in the channel region that lies beneath the gate electrode of the nFET. The present invention also provides a method of fabricating such a semiconductor structure. The new dual stress liner configuration includes a first stress liner that has an upper surface that is substantially planar with an upper surface of a fully silicided gate electrode of the nFET. In accordance with the present invention, the first stress liner is not present atop the nFET including the fully silicided gate electrode. Instead, the first stress liner of the present invention partially wraps around, i.e., partially surrounds the sides of, the nFET with the fully silicided gate electrode. A second stress liner having an opposite polarity (i.e., of an opposite stress type) as that of the first stress liner is located on the upper surface of the first stress liner as well as atop the nFET that contains the fully silicided gate electrode.

Figure 1A:
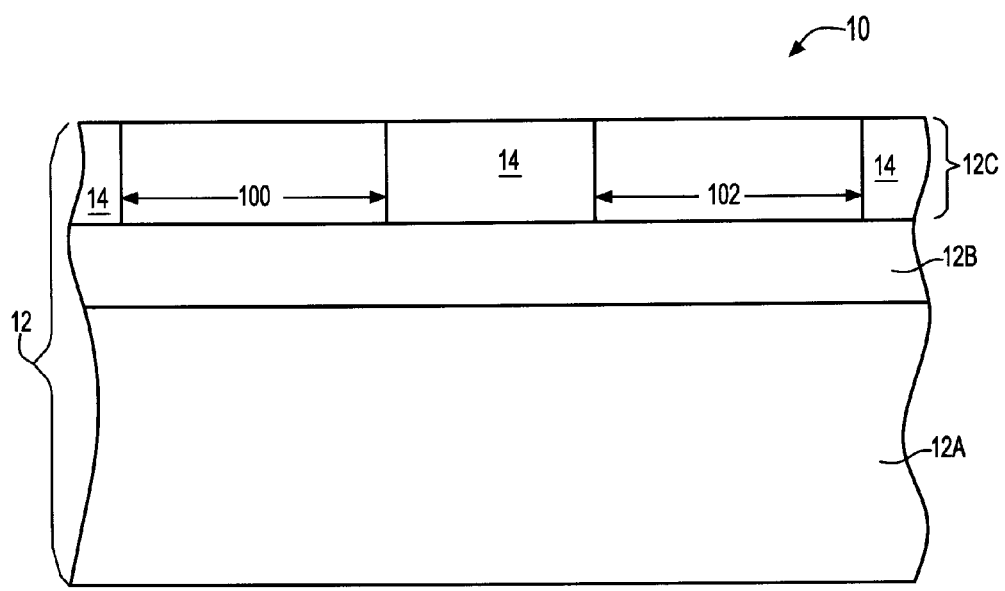
FIGS. 1A-1G are pictorial representations (through cross sectional views) illustrating the basic processing flow of the present invention.

Reference is now made to FIG. 1A which illustrates an initial structure 10 that is employed in the present invention. As illustrated, the initial structure 10 includes a semiconductor substrate 12 having isolation regions 14 located therein. The structure includes at least one nFET region 100 and at least one pFET region 102 that are separated in part by a trench isolation region 14.

The semiconductor substrate 12 includes any semiconductor material including, for example, Si, SiC, SiGeC, Ge, SiGe, Ga, GaAs, InAs, InP as well as other III/V or II/VI compound semiconductors. Layered semiconductors such as, for example, Si/SiGe and semiconductor-on-insulators (SOIs) as well as bulk semiconductor substrates are also contemplated herein. FIG. 1A illustrates an embodiment in which an SOI substrate is employed. Typically, the semiconductor substrate 12 is a Si-containing semiconductor such as, for example, Si, SiC, SiGe, SiGeC, or a silicon-on-insulator. The substrate 12 may be unstrained, strained or include regions of strain and unstrain therein. The substrate 12 may be intrinsic or it may be doped with, for example, but not limited to: B, As or P.

When SOI substrates are employed, those substrates include a top semiconductor layer 12C and a bottom semiconductor layer 12A that are separated at least in part by a buried insulating layer 12B. The buried insulating layer 12B includes, for example, a crystalline or non-crystalline oxide, nitride or any combination thereof. Preferably, the buried insulating layer 12B is an oxide. Typically, the buried insulating layer 12B is formed during initial stages of a layer transfer process or during an ion implantation and annealing process, such as, for example, SIMOX (separation by ion implantation of oxygen).

The substrate 12 may have a single crystal orientation or alternatively hybrid semiconductor substrates having surface regions of different crystal orientations can also be employed. The hybrid substrate allows for fabricating a FET upon a specific crystal orientation that enhances the performance of each FET formed. For example, the hybrid substrate allows for providing a structure in which a pFET can be formed on a (110) crystal orientation, while the nFET can be formed on a (100) crystal orientation. When a hybrid substrate is used, it may have SOI-like properties, bulk-like properties or a combination of SOI- and bulk-like properties.

In some embodiments of the present invention, at least one isolation region 14 is formed into the substrate 12. The at least one isolation region 14 may include a trench isolation region, a field oxide isolation region or combinations thereof. The at least one isolation region 14 is formed utilizing processing techniques well known to those skilled in the art. The depth of the at least one isolation region 14 that is formed into the semiconductor substrate 12 may vary depending on the process employed. FIG. 1A shows an embodiment in which the isolation regions 14 are trench isolation regions whose depths extend to the upper surface of the buried insulating layer 12B. Although such an embodiment is shown, the present invention is not limited thereto.

Figure 1B:
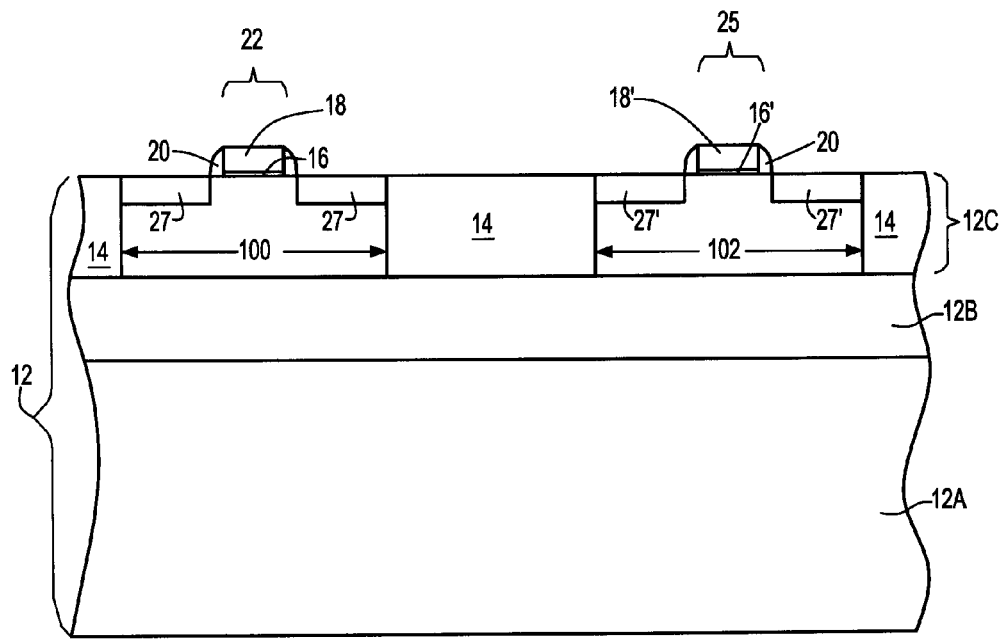

FIG. 1B shows a structure after further processing steps are performed in which at least one n-type field effect transistor (nFET) 22 is formed on an active surface of the semiconductor substrate 12 in the at least one nFET region 100 and at least one pFET 25 is formed on an active surface of the semiconductor substrate 12 in the at least one pFET region 102. As shown in FIG. 1B, the at least one nFET 22 includes a material stack comprising at least a fully silicided gate electrode 18 overlying a gate dielectric 16, and the at least one pFET 25 includes a material stack comprising at least fully silicided gate electrode 18' and a gate dielectric 16'. The nFETs and pFETs also include at least one spacer 20 that is located on vertical sidewalls of the material stack. Source/drain regions 27 (doped appropriately for nFETs) and 27' (doped appropriately for pFETs) are also shown in the active layer, i.e., top SOI layer 12C, of substrate 12.

The gate dielectrics 16 and 16' comprise any insulating material including, for example, an oxide, nitride, oxynitride, high k material (i.e., a dielectric material having a dielectric constant that is greater than silicon dioxide) or any combination thereof including multilayers. The gate dielectrics 16 and 16' may comprise the same, or different insulating material. Preferably, the gate dielectrics 16 and 16' are both comprised of an oxide such as, for example, $SiO_2$.

The gate dielectrics 16 and 16' are formed utilizing a conventional deposition process including, for example, chemical vapor deposition (CVD), plasma enhanced chemical vapor deposition (PECVD), atomic layer deposition (ALD), evaporation and chemical solution deposition. Alternatively, the gate dielectrics 16 and 16' can be formed by a thermal process such as, for example, oxidation, nitridation and/or oxynitridation. In some embodiments, a combination of the aforementioned techniques can be employed.

The thickness of the gate dielectrics 16 and 16' may vary depending on the chemical nature of the insulating material, the number of insulating materials present, and the technique that was used to form the same. Typically, the gate dielectrics 16 and 16' each has a thickness from about 0.5 to about 10 nm, with a thickness from about 1.0 to about 1.5 nm being even more typical.

The fully silicided gate electrodes 18 and 18' are comprised of a same or different silicide comprising a metal that is capable of reacting with a Si-containing material to form a metal silicide. Examples of such metals include, but are not limited to, Ti, Ta, W, Co, Ni, Pt, Pd and alloys thereof. In one performed embodiment, the metal is Co, Ni or Pt.

The fully silicided gate electrodes 18 and 18' are formed utilizing a conventional silicide process in which a Si-containing material such as polySi, SiGe or multilayers thereof is formed atop the gate dielectric. Preferably, a multilayer stack comprises a bottom layer of polySi and a top layer of SiGe is employed.

The Si-containing material is first formed by a conventional deposition process including for example, CVD, PECVD, evaporation and chemical solution deposition. Dopant ions may then be implanted into the Si-containing material. In one embodiment, the dopant ions can be introduced into the Si-containing material by an in-situ deposition process. It is noted that block masks can be used to selectively dope the Si-containing material for the nFET and the pFET, and after doping the block masks are stripped utilizing a conventional stripping process.

After forming the Si-containing material atop the gate dielectrics 16 and 16', lithography and etching are used to form gate regions including, from top to bottom, the Si-containing material and the gate dielectric. The lithographic step includes applying a photoresist to the exposed surface of the Si-containing material, exposing the photoresist to a pattern of radiation and developing the exposed photoresist utilizing a conventional developer solution. The etching step includes a chemical etching process, a dry etching process or combinations thereof. Preferably, a dry etching process such as, for example, reactive ion etching (RIE), is employed.

After forming the gate regions, a spacer is formed on vertical sidewalls of each of the gate regions. The spacer is comprised of a conventional insulating material including an oxide, nitride, or oxynitride. Multilayers of such materials are also contemplated. Typically, oxide spacers are employed. The spacer is formed by a conventional deposition process and etching.

An etching process that selectively removes a least a portion of the Si-containing material from the gate regions is then performed. When the Si-containing material includes a stack of SiGe and polySi, the SiGe is selectively removed utilizing $NH_4OH$ or HF. At this point, dopant ions can be ion implanted into the remaining portions of the Si-containing material to modulate the workfunction of the gate electrode to be subsequently formed. A conventional activation anneal is then performed at a temperature of about 800° C. or greater to active the dopant ions.

At this point in fabricating a fully silicided gate electrode, one of the above-mentioned metals is then formed over the structure utilizing a conventional deposition process such as, for example, CVD, PECVD, sputtering, plating and metalorgano deposition. The thickness of the metal deposited may vary so long as the thickness is sufficient to form a fully silicided gate electrode. Typically, the metal deposited has a thickness from about 3 to about 20 nm, with a thickness from about 7 to about 12 nm being even more typical.

Annealing is then performed to cause reaction between the Si-containing material and the metal forming a metal silicide. A single anneal step can be used or two annealing steps can be used. The annealing temperature of the first anneal and second anneal may vary depending on the type of metal used in forming the silicide. Following annealing, any unreacted metal can be removed utilizing a conventional stripping process.

The fully silicide gate electrodes 18 and 18' so formed each has a vertical height from about 10 to about 50 nm, with a vertical height from about 25 to about 35 nm being even more typical.

The spacer 20 employed above is then etched such that it does not extend above the upper surface of the fully silicided gate electrode 18.

At this point of the present invention, extension implants, source/drain implants and halo implants may be performed to form extension regions, source/drain regions and halo implant regions within the active region of semiconductor substrate 12. For the sake of clarity, these implant regions are labeled as 27 for nFET 22 and 27' for pFET 25 in FIG. 1B. As is known to those skilled in the art, the region of the semiconductor substrate beneath the gate electrode that is laterally confined by the source/drain regions is the channel region of the device. Block masks can be used during the doping of the FETs of different conductivity type.

Figure 1C:
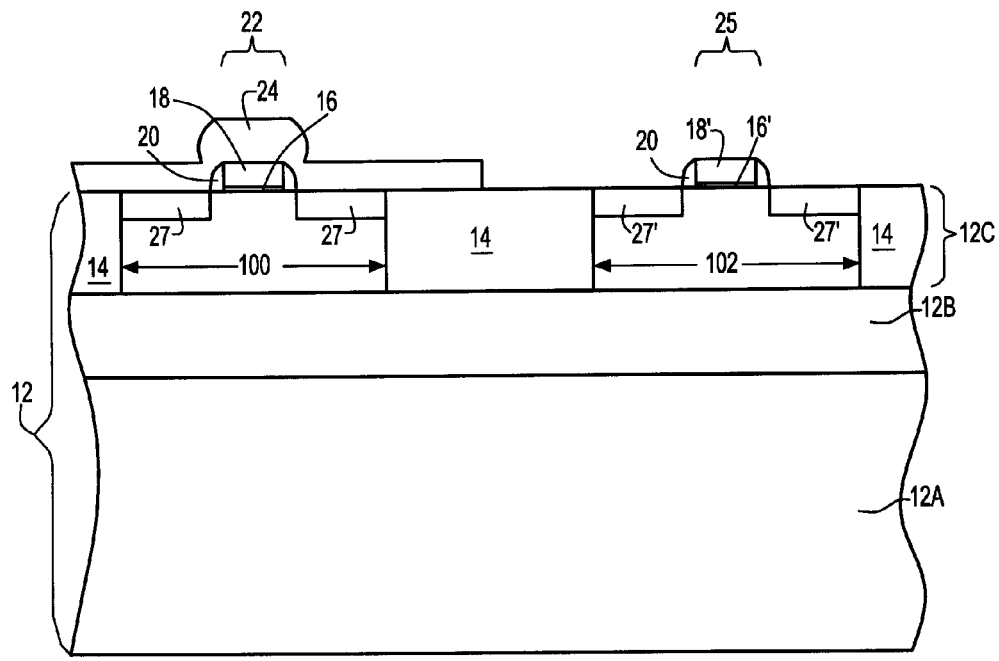

Next, and as shown in FIG. 1C, a first stress liner 24 (e.g., a tensile stress liner) is formed on the structure including atop the at least one nFET 22. It is noted that at this point of the present invention, the first stress liner 24 completely surrounds the at least one nFET 22. Note that the first stress liner 24 is not present on the at least one pFET 25.

The first stress liner 24 (i.e., tensile stress liner) is comprised of any stress inducing material such as, for example, a nitride or a high-density plasma oxide, or a combination thereof. The first stress liner 24 can be formed by various chemical vapor deposition (CVD) processes such as low pressure CVD (LPCVD), plasma enhanced CVD (PECVD), rapid thermal CVD (RTCVD) or BTBAS-based ($C_8H_{22}N_2Si$ reacted with ammonia) CVD, where BTBAS is a modern metalorganic precursor for CVD application. It is noted that when Ni silicide is used as the gate electrode, BTBAS-based CVD will not work.

Preferably, the first stress liner 24 comprises a nitride, such as $Si_3N_4$, wherein the process conditions of the deposition process are selected to provide an intrinsic tensile stress within the deposited layer. For example, plasma enhanced chemical vapor deposition (PECVD) can provide nitride stress liners having an intrinsic tensile stress. The stress state (tensile or compressive) of the nitride stress liners deposited by PECVD can be controlled by changing the deposition conditions to alter the reaction rate within the deposition chamber. More specifically, the stress state of the deposited nitride stress liner may be set by changing the deposition conditions such as: $SiH_4/N_2$/He gas flow rate, pressure, RF power, and electrode gap. In another example, rapid thermal chemical vapor deposition (RTCVD) can provide nitride tensile stress liners having an internal tensile stress. The magnitude of the internal tensile stress produced within the nitride tensile stress liner deposited by RTCVD can be controlled by changing the deposition conditions. More specifically, the magnitude of the tensile stress within the nitride stress liner may be set by changing deposition conditions such as: precursor composition, precursor flow rate and temperature.

As shown in FIG. 1C, the first stress liner 24, which is under tensile stress, is selectively removed from the pFET 25 by first utilizing a block mask to protect the region of the structure including nFETs, and then a conventional stripping process is employed.

Figure 1D:
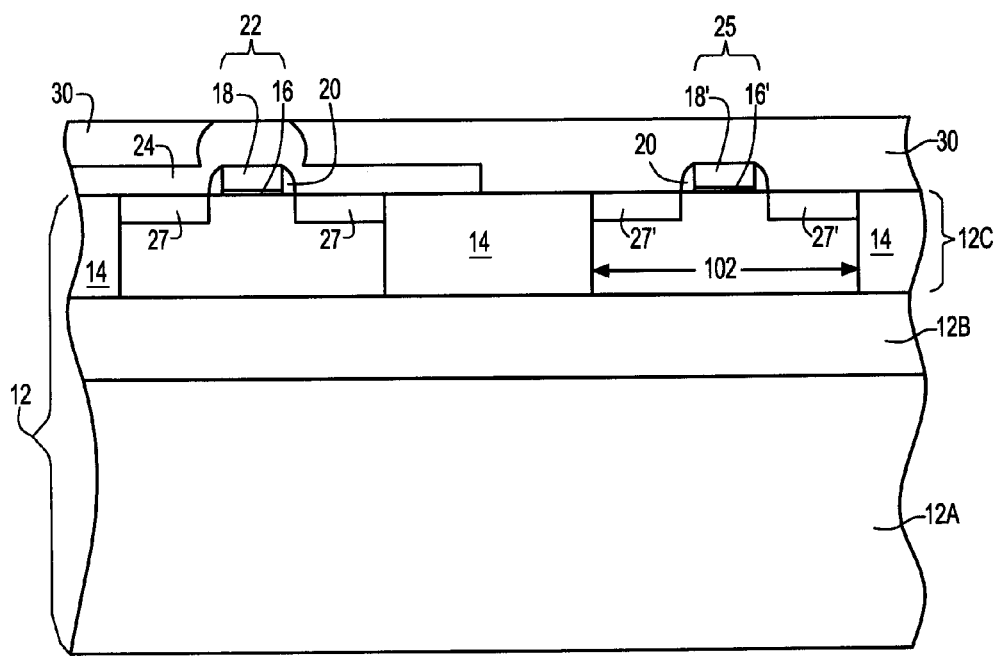

The block mask is then removed and a planarizing material 30 such as, for example, an antireflective coating (ARC), or silicate glass is deposited utilizing a conventional deposition process such as spin-on coating and then planarized to provide the structure shown in FIG. 1D. As is shown, the planarized material is removed from atop the first stress 24 that is located above the fully silicided gate electrode 18 of the at least one nFET.

Figure 1E:
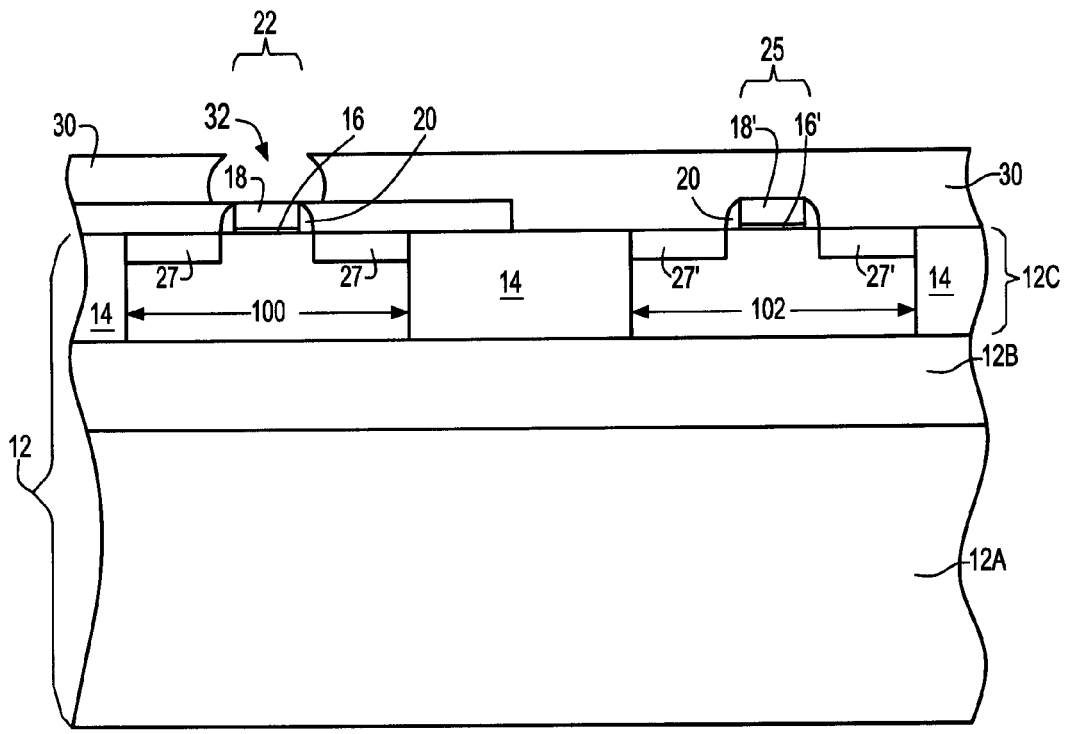

The exposed portion of the first stress liner 24 is then removed utilizing an etching process that is selective towards the material of the first stress liner material 24 providing an opening 32 above the fully silicided gate electrode 18 of the at least one pFET 22. The resultant structure including opening 32 is shown, for example, in FIG. 1E. When the first stress liner 24 is a nitride, a self-aligned nitride etch can be used to remove the exposed portion of the first stress liner 24.

Figure 1F:
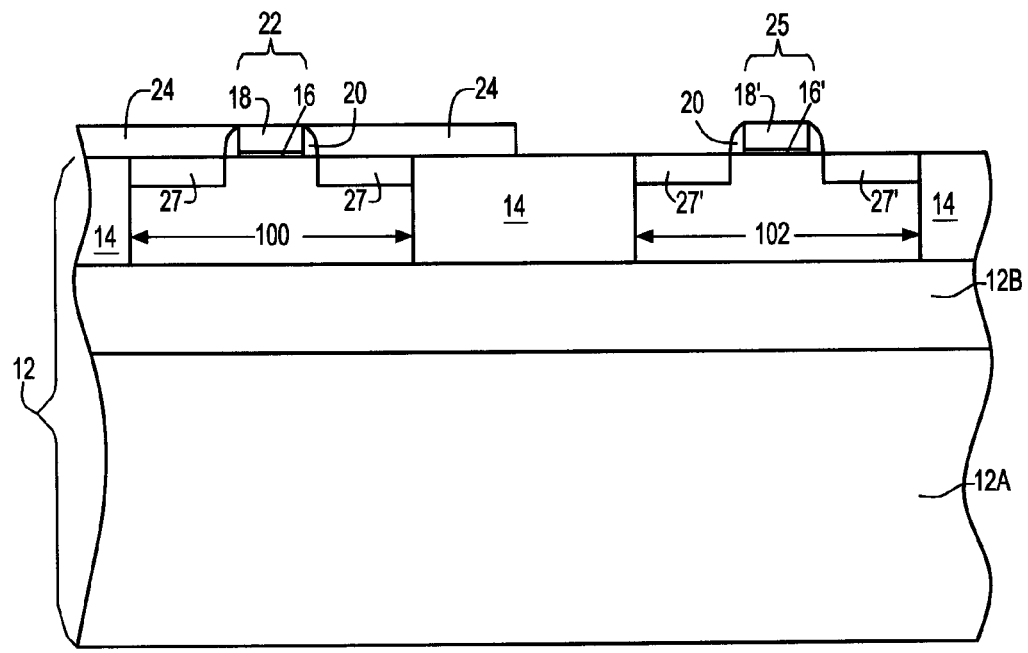

After the selective etching of the first stress liner 24, the planarizing material 30 is removed providing the structure shown in FIG. 1F. As is shown in FIG. 1F, the remaining first stress liner 24 is located on the semiconductor substrate 12 and it partially wraps around the at least one nFET 22 including the fully silicided gate electrode 18. In addition, the first stress liner 24 has an upper surface that is substantially planar with an upper surface of the fully silicided gate electrode 18 of the at least one nFET 22.

Figure 1G:
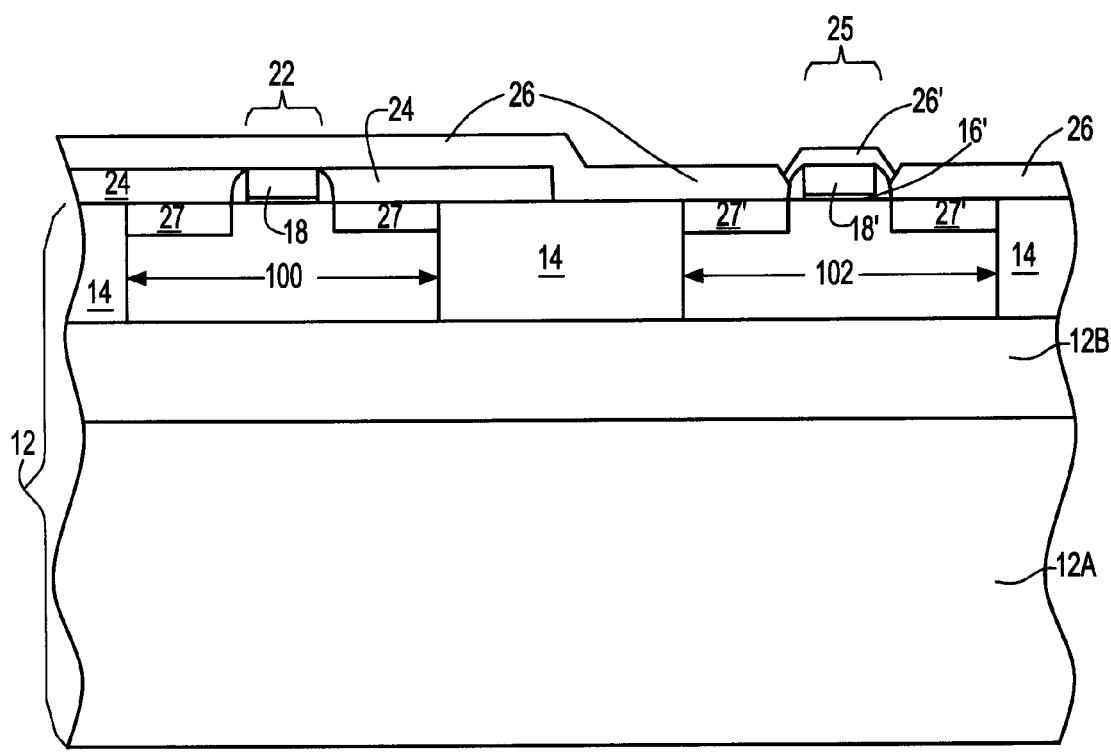

FIG. 1G shows a structure after forming a second stress liner 26 of an opposite type (i.e., compressive stress liner) as the first stress liner 24 on the upper surface of the first stress liner 24 as well as the at least one nFET 22; note that the second stress liner 26 completely surrounds the at least one pFET 25. As shown, a small amount of the second stress liner 26' is located atop the gate electrode 18' of the at least one pFET 25. The second stress liner 26 is comprised of the same or different stress inducing material as the first stress liner 24 and it is formed utilizing a conventional process that is well known to those skilled in the art which are quite similar to those mentioned above. In a highly preferred embodiment, the second stress liner 26 is a high-density plasma nitride In the case of an nFET including a tensile stress liner as the first stress liner 24 and a compressive stress liner as the second stress liner 26, the following exemplary values may be observed: The structure shown in FIG. 1G has a measured stress value of about 210 MPa or greater and after formation of the second stress liner 26 on the structure, the stress in the channel region does not change very significantly. In particular, the measured channel stress value for the structure shown in FIG. 1G is about 205 MPa or greater. It is again noted that the foregoing values are exemplary values and in no way limit the scope of the present invention.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A semiconductor structure comprising:
at least one n-type field effect transistor (nFET) located on a surface of a semiconductor structure, said at least one nFET including a material stack comprising a fully silicided gate electrode overlying a gate dielectric, and at least one spacer located on vertical sidewalls of said material stack;
a first stress liner located on said semiconductor substrate and partially wrapping around said at least one nFET, said first stress liner having an upper surface that is coplanar with an upper surface of said fully silicided gate electrode of said at least one nFET; wherein the first stress liner is not present atop the fully silicided gate electrode;
a second stress liner of an opposite stress type as that of the first stress liner located on said upper surface of said first stress liner and atop the at least one nFET.
at least one PFET isolated from said at least one nFET by a trench isolation region, said second stress liner completely surrounds and is present atop a gate electrode of said at least one pFET.

2. The semiconductor structure of claim 1 wherein said first stress liner is a tensile stress liner and said second stress liner is a compressive stress liner.

3. The semiconductor structure of claim 1 wherein said semiconductor substrate is a bulk semiconductor material or a semiconductor-on-insulator.

4. The semiconductor structure of claim 1 wherein said semiconductor substrate is a hybrid substrate having surface regions of different crystal orientation and said at least one nFET is located on a (100) crystal surface of said hybrid substrate.

5. The semiconductor structure of claim 1 wherein said fully silicided gate electrode comprises a metal silicide wherein said metal comprising Ti, Ta, W, Co, Ni, Pt, Pd or alloys thereof.

6. The semiconductor structure of claim 1 wherein said fully silicided gate electrode has a vertical height of about 10 to about 50 nm.

7. A semiconductor structure comprising:
at least one n-type field effect transistor located on a surface of a semiconductor structure, said at least one n-type field effect transistor including a material stack comprising a fully silicided gate electrode overlying a gate dielectric, and at least one spacer located on vertical sidewalls of said material stack;

a tensile stress nitride liner located on said semiconductor substrate and partially wrapping around said at least one n-type field effect transistor, said tensile stress nitride liner having an upper surface that is coplanar with an upper surface of said fully silicided gate electrode, wherein the tensile stress nitrate layer is not present atop the fully silicided gate electrode;

a compressive stress nitride liner located on said upper surface of said tensile stress nitride liner and atop the at least one n-type field effect transistor; and at least one p-type field effect transistor isolated from said at least one n-type field effect transistor by a trench isolation region, said compressive stress liner completely surrounds and is present atop a gate electrode of said at least one p-type field effect transistor.

8. The semiconductor structure of claim 7 wherein said tensile stress nitride liner has intrinsic tensile stress.

9. The semiconductor structure of claim 7 wherein said semiconductor substrate is a bulk semiconductor material or a semiconductor-on-insulator.

10. The semiconductor structure of claim 7 wherein said semiconductor substrate is a hybrid substrate having surface regions of different crystal orientation and said at least one n-type field effect transistor is located atop a surface having a (100) crystal orientation.

11. The semiconductor structure of claim 7 wherein said fully silicided gate electrode comprises a metal silicide wherein said metal comprises Ti, Ta, W, Co, Ni, Pt, Pd or alloys thereof.

12. A semiconductor structure comprising:
at least one n-type field effect transistor and at least one p-type field effect transistor located on a surface of a semiconductor structure, said at least one n-type field effect transistor including a material stack comprising a fully silicided gate electrode overlying a gate dielectric, and at least one spacer located on vertical sidewalls of said material stack;

a tensile stress liner located on a portion of said semiconductor substrate including said at least one n-type field effect transistor, said tensile stress liner partially wraps around said at least one n-type field effect transistor and has an upper surface that is coplanar with an upper surface of said fully silicided gate electrode, wherein the tensile stress liner is not present atop the fully silicided gate electrode; and a compressive stress liner located on said upper surface of said first stress liner and atop the at least one n-type field effect transistor, said compressive liner completely surrounds and is present atop said at least one p-type field effect transistor.

13. The semiconductor structure of claim 12 wherein said tensile stress liner and said compressive stress liner are both nitrides.

14. The semiconductor structure of claim 13 wherein said tensile stress nitride has intrinsic tensile stress.

15. The semiconductor structure of claim 12 wherein said semiconductor substrate is a bulk semiconductor material or a semiconductor-on-insulator or a hybrid substrate having surface regions of different crystal orientation.

16. The semiconductor structure of claim 12 wherein said fully silicided gate electrode comprises a metal silicide wherein said metal comprises Ti, Ta, W, Co, Ni, Pt, Pd or alloys thereof.

17. The semiconductor structure of claim 12 wherein said at least one nFET is located on a (100) crystal surface and said at least one pFET located on a (110) crystal surface of said semiconductor substrate.

18. A method of forming a semiconductor structure comprising:
providing at least one n-type field effect transistor and at least one p-type field effect transistor on a surface of a semiconductor structure, said at least one n-type field effect transistor including a material stack comprising a frilly silicided gate electrode overlying a gate dielectric, and at least one spacer located on vertical sidewalls of said material stack;

forming a first stress liner on said semiconductor substrate, wherein said first stress liner partially wraps wound said at least one n-type field effect transistor and has an upper surface that is coplanar with an upper surface of said fully silicided gate electrode of said n-type field effect transistor, wherein the first stress liner is not present atop the fully silicided gate electrode; and forming a second stress liner of an opposite stress type as that of the first stress liner on said upper surface of said first stress liner and atop the at least one n-type field effect transistor, said second stress liner completely surrounds and is present atop a gate electrode of said at least one pFET.

19. The method of claim 18 wherein said providing said at least one n-type field effect transistor comprises forming a stack comprising said gate dielectric and a Si-containing material, patterning said stack, forming a spacer on vertical sidewalls of said patterned stack, selectively removing a portion of said Si-containing material whereby some Si-containing material remains on said gate dielectric, forming a metal layer on said remaining Si-containing material and performing at least one annealing process which causes reaction between said metal layer and said remaining Si-containing material.

20. The method of claim 18 wherein said forming said first stress liner comprises chemical vapor deposition of at least one first stress inducing material, forming a planarizing material that exposes portions of the first stress liner atop said at least one field effect transistor, selectively removing the exposed portions of the first stress liner material and removing said planarizing material.

21. The method of claim 18 wherein said forming said second stress liner comprises chemical vapor deposition of at least one second stress inducing material.

22. The method of claim 18 wherein said first stress liner is a tensile stress liner and said second stress liner is a compressive stress liner.

* * * * *